(12) United States Patent
Ottens et al.

(10) Patent No.: US 8,384,881 B2
(45) Date of Patent: Feb. 26, 2013

(54) LITHOGRAPHIC APPARATUS, STAGE APPARATUS AND DEVICE MANUFACTURING METHOD

(75) Inventors: Joost Jeroen Ottens, Veldhoven (NL); Dirk-Jan Bijvoet, Eindhoven (NL); Gerbrand Van Der Zouw, Eindhoven (NL); Frederik Eduard De Jong, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 482 days.

(21) Appl. No.: 12/238,964

(22) Filed: Sep. 26, 2008

(65) Prior Publication Data

US 2009/0086180 A1    Apr. 2, 2009

Related U.S. Application Data

(60) Provisional application No. 60/960,440, filed on Sep. 28, 2007.

(51) Int. Cl.
*G03B 27/58* (2006.01)
*G03B 27/32* (2006.01)

(52) U.S. Cl. .......................................... 355/72; 355/77

(58) Field of Classification Search ............... 355/53, 355/75, 77, 72, 52
See application file for complete search history.

(56) References Cited

U.S. PATENT DOCUMENTS

| 6,320,645 B1 * | 11/2001 | Inoue et al. ..................... 355/53 |
| 7,884,919 B2 | 2/2011 | Hempenius et al. |
| 2006/0175910 A1 * | 8/2006 | Asano et al. ..................... 310/12 |
| 2007/0182947 A1 * | 8/2007 | Hempenius et al. ............. 355/75 |

FOREIGN PATENT DOCUMENTS

| JP | 01302195 A | 12/1989 |
| JP | 07-083999 A | 3/1995 |
| JP | 2007-227911 A | 9/2007 |

OTHER PUBLICATIONS

Office Action in Japanese application No. 2008-250641 mailed Feb. 23, 2011.

* cited by examiner

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A lithographic apparatus is described, the apparatus comprising an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate, a chuck constructed to hold the substrate table; a positioning device for, in use, displacing the chuck; a control unit configured to control the positioning device, wherein the control unit is arranged to drive the positioning device to excite the chuck by a substantially dynamic force to enable deformation of the chuck, prior to aligning the patterning device.

21 Claims, 4 Drawing Sheets

LITHOGRAPHIC APPARATUS, STAGE APPARATUS AND DEVICE MANUFACTURING METHOD

CROSS-REFERENCE TO RELATED APPLICATIONS

The present application claims priority to U.S. Provisional Application No. 60/960,440, filed on Sep. 28, 2007, titled "Lithographic Apparatus, Stage Apparatus and Device Manufacturing Method", the content of which is incorporated herein in its entirety by reference.

BACKGROUND

1. Field

The present invention relates to a lithographic apparatus including a chuck constructed to hold a substrate table, to a stage apparatus for positioning an object and to a device manufacturing method.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In the lithographic apparatus, the patterning device may be held by a support. Commonly, the apparatus will be provided with a positioning device (comprising e.g one or more linear motors or actuators) to move the support, thereby moving the patterning device held by the support. In the lithographic apparatus, the substrate is, in general, supported by a substrate table, the substrate table being mounted to a so-called chuck or carrier by means of clamping. The substrate table may e.g. be clamped to the chuck by means of a vacuum clamp or electrostatic clamp, although mechanical ways of clamping may also be considered feasible. The chuck may also be referred to as the mirror block in case the chuck is provided with one or more reflective surfaces that are used as a target for an interferometer beam. The chuck is in general displaceable using a similar positioning device as is used to position the support, i.e. a positioning device comprising one or more electromagnetic motors or actuators. In a lithographic apparatus as known in the art, the substrate table is provided with a clamping mechanism such as a vacuum clamp or an electrostatic clamp to clamp the substrate and hold the substrate during the exposure process. Once the exposure of the substrate is performed, the substrate can be removed from the table and replaced by a next substrate to be exposed. Similar provisions are in general available for clamping the patterning device to the support.

During the exposure process, it is important to know the actual position of the substrate relative to the patterning device in order to ensure that the pattern is projected on the correct target area of the substrate. In order to achieve this, the lithographic apparatus is provided with one or more measurement systems for determining the position of the substrate relative to the patterning device. In general, the relative position of the substrate with respect to the patterning device is determined using an alignment procedure. In such a procedure, the position of the patterning device relative to the substrate can e.g. be determined in an optical way, e.g. by any suitable operation in the projection system to have a pattern projected onto an appropriate part of the surface of the substrate. When the position of the support and the chuck are known in the aligned position of the patterning device and the substrate, the relative position of the substrate and the patterning device can be determined based on a position measurement of the support and the chuck. As such, controlling the position of the chuck and support can then be used to maintain the patterning device and the substrate at a required position with respect to each other or to control the relative position of the substrate and patterning device. To achieve this, the lithographic apparatus is, in general, equipped with a control unit arranged to control the positioning devices that displace the support and the chuck. This control unit can e.g. be arranged in such manner that both the substrate and the patterning device can follow a predetermined set-point.

In such a set-up, the accuracy of the exposure process, i.e. the accuracy with which the pattern is projected on the required position on the substrate relies e.g. on the position of the chuck relative to the substrate or substrate table being known. In principle, in case both the chuck and the substrate table would be infinitely stiff and clamped to each other such that no relative displacement can occur, the relative position between the chuck and table would remain constant over time. In such a situation, the position of the substrate can be determined on the basis of a position measurement of the chuck.

In practice, it has been found that the chucks as currently applied in lithographic apparatuses may deform due to a.o. the acceleration forces exerted on it, as the stiffness of such chucks is not infinitely high. It has further been found that this deformation to some extent remains present after the acceleration phase. As a result, such deformation of the chuck may contribute to an inaccurate exposure, i.e. the pattern of the patterning device may be exposed on the wrong place on the substrate, because the deformation may affect the position of the chuck relative to the substrate table.

It is therefore noted that a deformation of a chuck is undesired, as this would adversely affect an accuracy of a positioning of the pattern on the substrate, thereby deteriorating a performance of the lithographic apparatus.

SUMMARY

It is desirable to reduce the effect of a deformation of a chuck that is arranged to support a substrate table (or in general an object table) of, for example, a lithographic apparatus.

According to an embodiment of the invention, there is provided a lithographic apparatus comprising: an illumination system configured to condition a radiation beam; a support constructed to support a patterning device, the patterning device being capable of imparting the radiation beam with a pattern in its cross-section to form a patterned radiation beam;

a substrate table constructed to hold a substrate; a projection system configured to project the patterned radiation beam onto a target portion of the substrate, a chuck constructed to hold the substrate table; a positioning device for, in use, displacing the chuck; a control unit configured to control the positioning device, wherein the control unit is arranged to drive the positioning device to excite the chuck by a substantially dynamic force to enable deformation of the chuck, prior to aligning the patterning device.

In another embodiment of the invention, there is provided a stage apparatus for positioning an object, the stage apparatus comprising: a table constructed to hold the object; a chuck constructed to hold the table; a positioning device for, in use, displacing the chuck; a control unit configured to control the positioning device; wherein the control unit is arranged to drive the positioning device to excite the chuck by a substantially dynamic force to enable a deformation of the chuck.

In yet another embodiment of the invention, there is provided a device manufacturing method comprising transferring a pattern from a patterning device onto a substrate, the substrate being held by a substrate table, the substrate table being held by a chuck, the method comprising:
a) applying a substantially stationary force between the substrate table and the chuck to hold the substrate table;
b) excitating the chuck by a substantially dynamic force to enable deformation of the chuck;
c) aligning the patterning device with the substrate; and
d) transferring the pattern from the patterning device onto the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
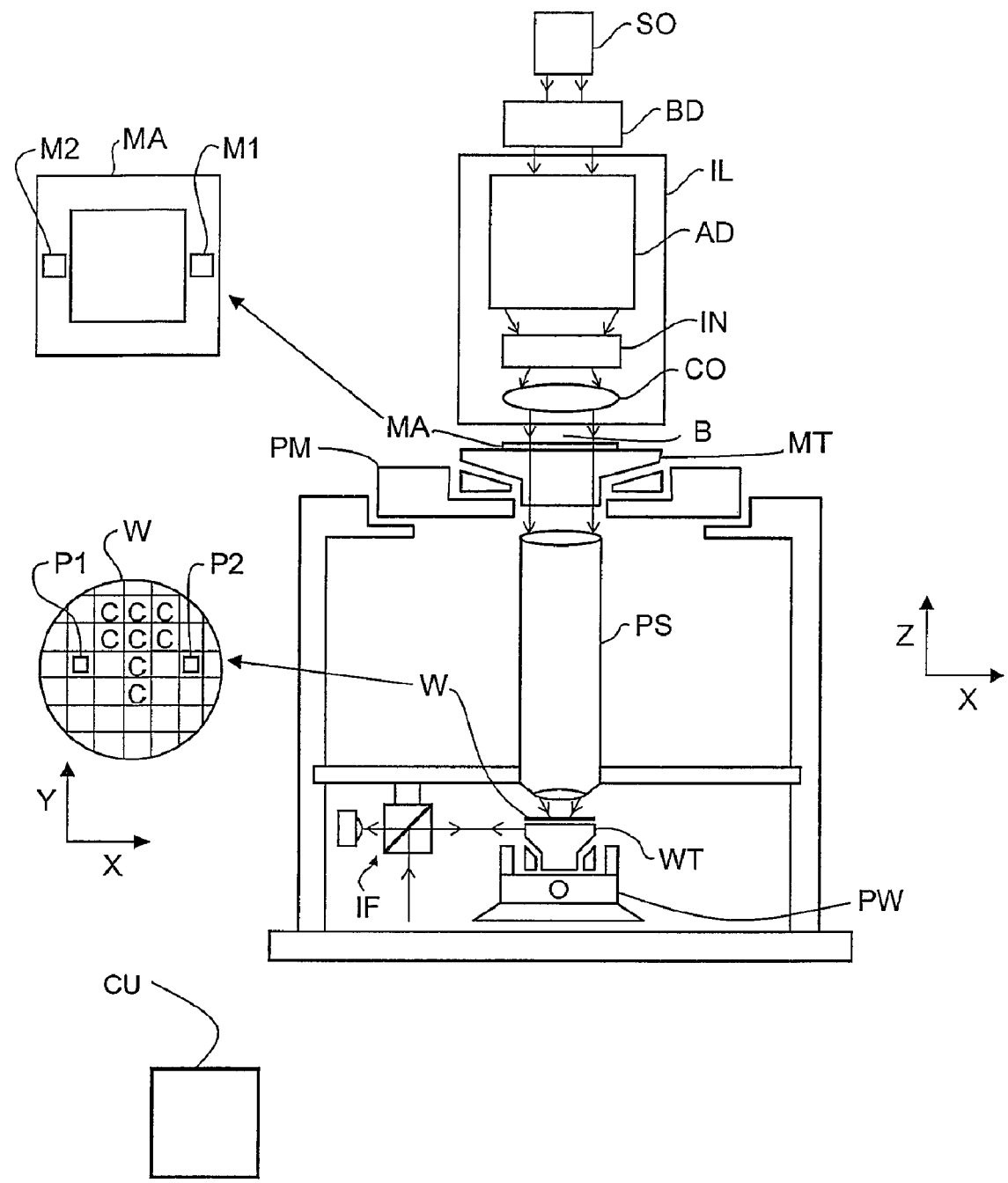
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B. e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In general, the substrate table is arranged on a chuck (not shown in the figure) by e.g. a vacuum clamp or an electrostatic clamp. The chuck is usually made of a material having a low thermal expansion coefficient, such as Zerodur. As such, the second positioner PW is arranged to displace (and position) the chuck that supports the substrate table. In general, the chuck requires displacement over comparatively long strokes in a two-dimensional plane whereas the support that supports the patterning device requires only long stroke displacements in one direction. As such, the long stroke module of the positioning device PM may comprise one or more linear motors substantially acting in one direction whereas the second positioner PW may e.g. comprises a cascaded arrangement of linear motors operating in different directions or a planar motor. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 1 further schematically depicts a control unit CU, arranged to control the second positioner PW in order to excite the chuck by a substantially dynamic force to enable deformation of the chuck, prior to aligning the mask with the substrate.

By doing so, as explained below in more detail, an hysteresis effect of a chuck deformation caused by accelerating the chuck, can be mitigated. As a result, the relative position between the chuck and the substrate table is less affected by the accelerations of the chuck. This enables an improved accuracy of the exposure process because there can be a better correspondence between the position measurement of the chuck and the actual position of the substrate.

Figure 2:
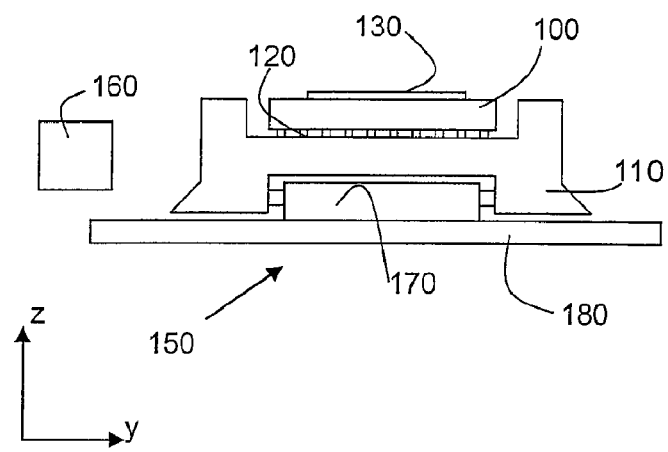
FIG. 2 depicts a side view of an embodiment of a stage apparatus according to the present invention.
Figure 3A:
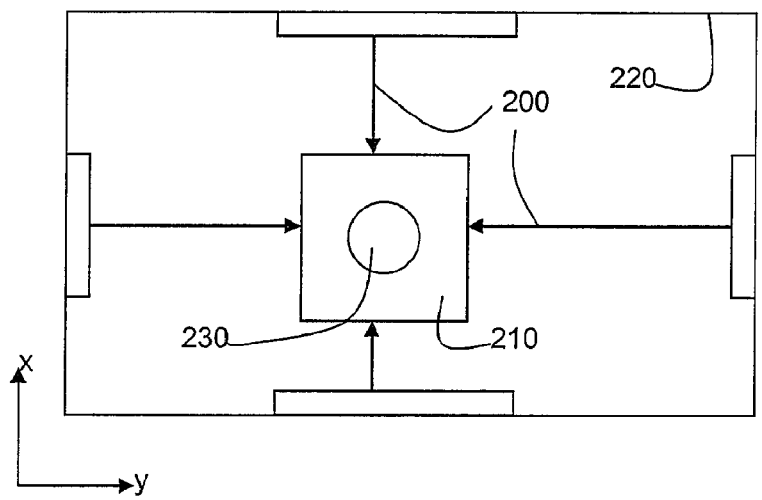
FIG. 3a schematically depicts a top view of a stage apparatus according to the present invention together with a first measurement arrangement.
Figure 3B:
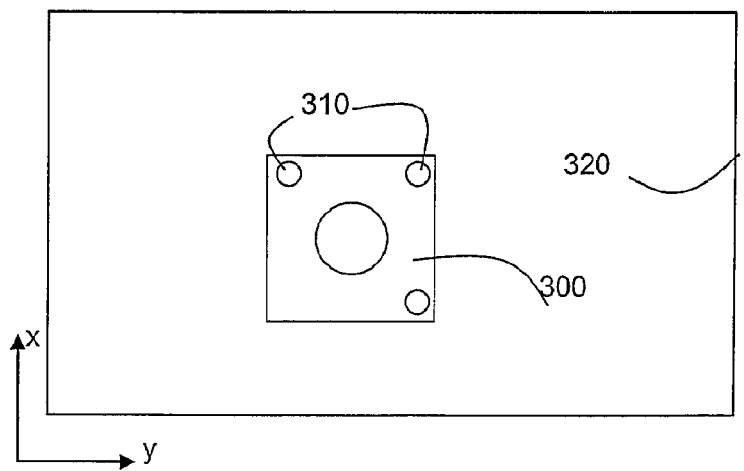
FIG. 3b schematically depicts a top view of a stage apparatus according to the present invention together with a second measurement arrangement.

FIG. 2 schematically depicts an embodiment of a stage apparatus according to the invention. Such a stage apparatus may e.g. be applied in a lithographic apparatus for positioning a patterning device or a substrate. FIG. 2 schematically depicts a substrate table 100 mounted to a chuck 110 via a clamping mechanism 120 e.g. a vacuum or electrostatic clamp. A substrate 130 is mounted to the substrate table 100. The chuck 110 is mounted to a positioning device 150 which can e.g. comprise a plurality of actuators that enable the positioning of the chuck in 6 degrees of freedom. As described above, the positioning device can comprise a so-called short-stroke module 170 enabling positioning with nm accuracy over a short distance combined with a so-called long-stroke module 180 which enables a displacement over longer distances but with less accuracy. In general, the chuck may be mounted to the short-stroke module and the long-stroke module is arranged to displace the short-stroke module. By doing so, accurate positioning of the chuck over the entire operating range of the long-stroke module can be obtained. The stage apparatus may further comprise a control unit 160 for controlling the positioning device. The control unit is arranged drive the positioning device to excite the chuck by a substantially dynamic force to enable deformation of the chuck. In case such a stage apparatus is applied in a lithographic apparatus, it can be used to accurately displace and position e.g. a substrate. In such an arrangement, the lithographic apparatus can be equipped with a measurement system arranged to co-operate with the chuck of the stage apparatus. FIGS. 3a and 3b schematically depict two examples of such an arrangement.

FIG. 3a schematically depicts a top view of a stage apparatus according to the present invention together with a first measurement arrangement. The measurement arrangement comprises a plurality of interferometer beams (indicated by the arrows 200) that are arranged to measure the X and Y position of the chuck 210 of the stage apparatus (other components of the stage apparatus are not shown for clarity reasons) relative to a stationary part 220 of the apparatus in which the stage apparatus is applied The stationary part 220 can e.g. be a metrology frame of the apparatus but it may also be e.g. a projection system of the apparatus. Also indicated in FIG. 3a is a substrate 230 mounted to a substrate table (not shown) of the stage apparatus.

FIG. 3b schematically depicts a top view of a stage apparatus according to the present invention together with a second measurement arrangement. In the second measurement system, the chuck 300 is provided with a plurality of sensors 310 arranged to co-operate with a 1 or 2-dimensional grating (not shown) to provide information on the X- and or Y-position of the chuck relative to a stationary part 320 of the apparatus in which the stage apparatus is used. The 1- or 2-dimensional grating can e.g. be mounted to this stationary part 320. As an example, the grating may be mounted to a projection system of a lithographic apparatus, thereby enabling the positioning of the chuck relative to the projection system.

As will be clear from the arrangements as shown in FIGS. 3a, 3b, the position of the object (e.g. the substrate) mounted to the table of the stage apparatus is determined via a position measurement of the chuck on which the table is mounted.

Figure 4:
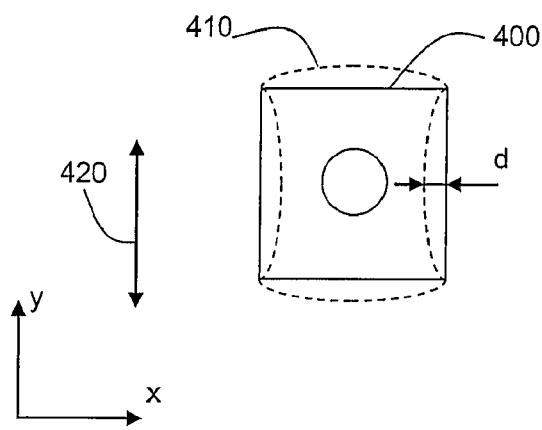
FIG. 4 schematically depicts a possible deformation of a chuck as applied in a stage apparatus according to the invention.
Figure 5A:
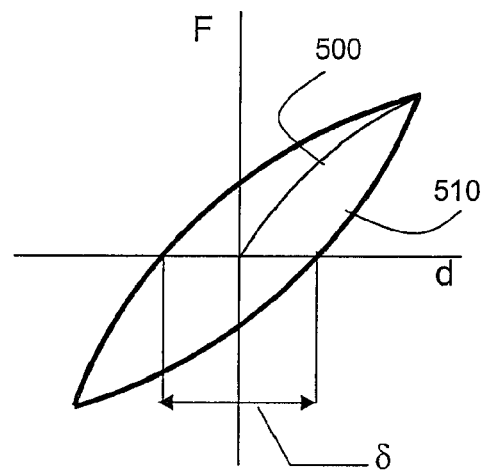
FIG. 5a schematically depicts the deformation of a chuck as a function of the applied force.
Figure 5B:
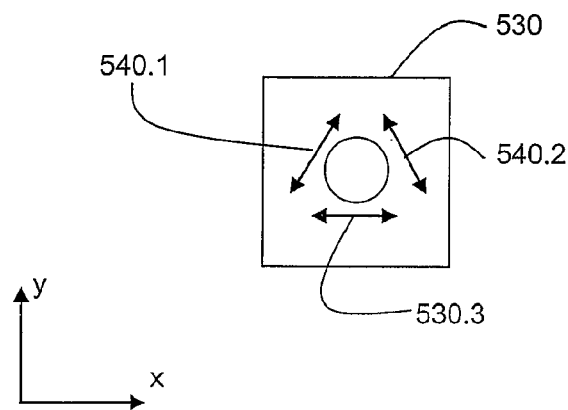
FIG. 5b schematically depicts a chuck as can be applied in a stage apparatus according to the present invention together with possible actuator forces acting on the chuck FIG. 5c schematically depicts a chuck as can be applied in a stage apparatus according to the present invention, in a deformed and a non-deformed state, together with actuator forces causing the deformation FIG. 6a schematically depicts a chuck, in its deformed and non-deformed shape, of a stage apparatus according to the present invention for use in an interferometer based measurement system.
Figure 5C:
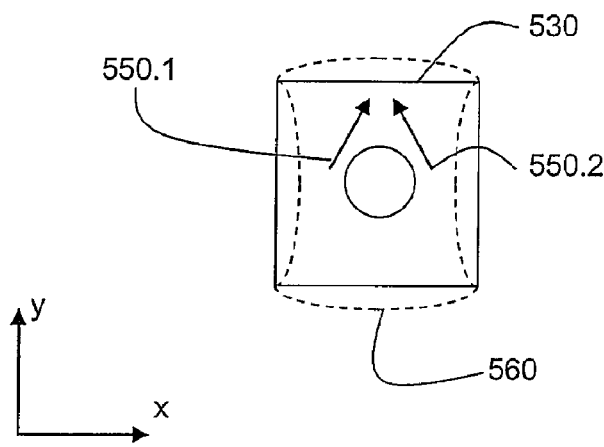

The inventors have devised that, when the chuck is subject to accelerations, a deformation of the chuck may occur. An example of a possible deformation of a chuck is schematically depicted in FIG. 4. FIG. 4 schematically depicts a top view of a chuck 400 (non-deformed shape) and a (exaggerated) deformed shape 410 when the chuck is subject to an acceleration along the direction as indicated by the arrow 420. It has further been found by the inventors that this deformation does not entirely disappears when the acceleration becomes zero but an hysteresis effect can be noticed. FIG. 5a schematically depicts in a qualitative manner a measure of the deformation d (as indicated in FIG. 4) as a function of the applied force F. As can be seen from this figure, when a force has been applied (e.g. following the trajectories 500 and 510) a residual deformation (hysteresis effect) 6 remains. It can further be noted that the actual shape of the deformation depends on the way the forces of the positioning device are introduced to the chuck. A deformation as shown in FIG. 4 can e.g. be the result of a set of actuator forces as shown in FIGS. 5b and 5c. FIG. 5b schematically depicts a chuck 530 and arrows 540.1, 540.2, and 540.3 indicating in which directions forces can be applied to the chuck (e.g. by three Lorentz actuators). FIG. 5c schematically depicts the chuck 530 together with the required actuator forces 550.1 and 550.2 to accelerate the chuck in the positive Y-direction. FIG. 5c also shows the corresponding deformation of the chuck by the dotted line 560. In case the chuck needs to be accelerated in e.g. the X-direction, it will be clear to the skilled person that a different force distribution is required, resulting in a different deformation of the chuck.

Figure 6A:
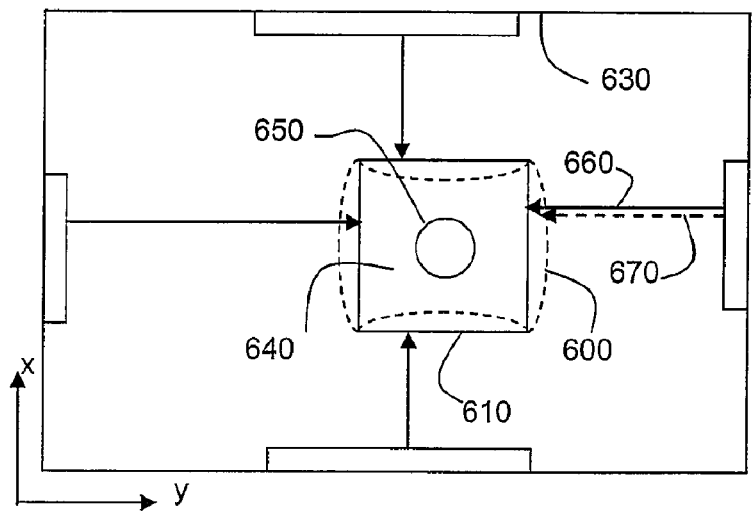
FIG. 6b schematically depicts a chuck, in its deformed and non-deformed shape, of a stage apparatus according to the present invention for use in an encoder based measurement system.

In case the residual deformation of the chuck is not taken into account, it will be clear to the skilled person that a position of an object on a table mounted to the chuck will be mischaracterized when this position is determined on the basis of a position measurement of the chuck. This is illustrated in FIG. 6a for the arrangement of FIG. 3a. FIG. 6a schematically depicts a stage apparatus according to the present invention together with an interferometer measurement system. The chuck is shown in both its deformed state 600 (dotted line) and in its non-deformed state 610 (solid line). As can be seen, the beam path (distance between the stationary part 630 of the apparatus in which the stage apparatus is applied and the chuck 640) is different in the deformed shape and in the non-deformed shape. Assuming the distance between the object 650 and the border 660 of the chuck is known for the non-deformed shape, it will be clear that this distance cannot be applied for determining the position of the object when the chuck is deformed. As illustrated, a position measurement of the chuck in its non-deformed state by interferometer beam 660 would provide different information to the control unit controlling the position of the chuck than a measurement of the chuck in its deformed state for which the corresponding interferometer beam is indicated by 670.

Figure 6B:
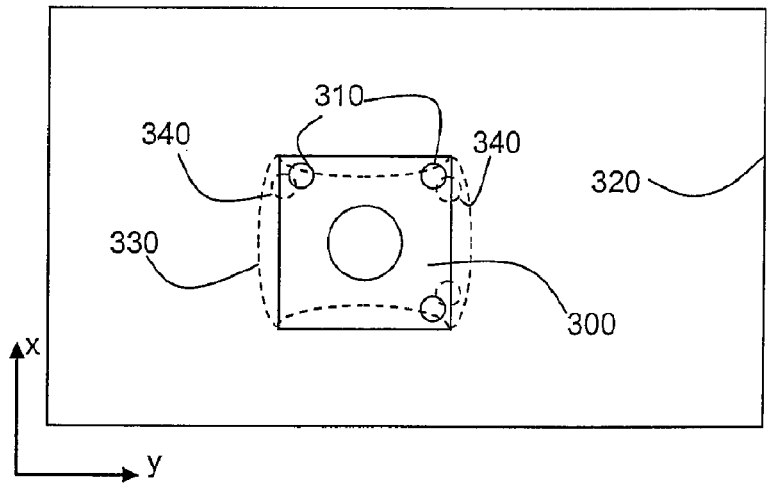

It can be noted that similar considerations are valid in case an encoder based measurement system is applied (as schematically described in FIG. 3b) since a deformation of the chuck would result in a displacement of the sensors mounted to the chuck which would lead to a mischaracterization of the distance between the sensors on the chuck and the object mounted to the table that is mounted to the chuck. This is illustrated in FIG. 6b. FIG. 6b schematically depicts the arrangement of FIG. 3b together with (in dotted line) the deformation of the chuck. As can be seen, due to the deformation, the position of the sensors also shifts (indicated by the dotten sensor positions 340, this shift may e.g. result in a mischaracterization of the distance between the sensor and the substrate.

Several causes can be identified that may contribute to the deformation of the chuck. In particular, it can be mentioned that the stiffness of the chuck plays a role, but also the weight of the table that is clamped to the chuck. These causes are in particular important for a chuck as applied in an immersion lithographic apparatus. Compared to a chuck as is applied in a conventional lithographic apparatus, a chuck as applied in an immersion lithographic apparatus may be less stiff and may be provided with a heavier table (substrate table). The latter may be caused by the presence of provisions for the conditioning of the substrate (e.g. thermal conditioning) or provisions for the management of the immersion liquid. The reduction in stiffness of the chuck may be caused by the fact that the substrate table of such a chuck is a certain extend embedded in the chuck rather than being mounted on the chuck. Therefore, in order to receive the table, a cut-out may be provided in such a chuck, which may reduce the stiffness of the chuck. It can further be noted that, in general, the substrate table as applied in an immersion lithography chuck may be heavier compared to a conventional substrate table. In general, it is further worthwhile to note that due to an increasing demand with respect to performance and throughput, present apparatuses operate at increased acceleration levels, making the mentioned deformation more apparent.

It can be noted that experiments have shown that the actual deformation of the chuck during acceleration can be 100 nm at an acceleration of approx. 20 m/sec$^2$. The residual deformation is such case can be up to 5 nm. It will be clear to the skilled person that, as this deformation may result in a mischaracterization of the position of e.g. a substrate in a lithographic apparatus, this would provide a considerable contribution to the overlay error of the exposure process of the substrate.

The inventors have devised that the phenomenon of residual deformation may be reduced by submitting the chuck to an acceleration. Experiments have shown that the hysterisis effect is not constant but diminishes over time (i.e. the more the chuck is subject to accelerations, the smaller the residual deformation becomes. Therefore, by applying an acceleration to the chuck for a certain period of time, the residual deformation can be reduced. This process is further on also referred to as shaking the chuck. Although it would be feasible to perform the shaking of the chuck using a dedicated actuator solely for this purpose, it is preferred to applied the positioning device of the stage apparatus or lithographic apparatus for this purpose.

The inventors have found that the reduction of the residual deformation can be diminished in different ways.

According to an embodiment of the invention, the chuck can be excited by a substantially dynamic force to enable the deformation of the chuck. The dynamic force may have any profile, for example it may have a form of an impulse, a shock wave, it may periodically change over time (e.g. an alternating signal), etc. As an example of such a dynamic force, the scanning exposure cycle as applied in a lithographic apparatus can be applied for this. Therefore, as an example, in order to diminish the effect of a deformation of a chuck applied to hold substrate table in a lithographic apparatus, one can consider performing a number of scanning exposure cycles prior to the actual exposure. It will be clear that merely the displacements of the scanning exposure cycle are to be performed, not the actual exposure. It can be noted that this process can be performed with or without a substrate being loaded on to the substrate table. Experiments have shown that when the scanning exposure cycles are performed during approx. 30 min, the residual deformation can e.g. be reduced from ~5 nm to approx. ~2 nm. (note that during this period ~1000 or more scanning exposures cycles can be performed)

The dynamic force as applied to shake the chuck may also be an alternating force at a higher frequency compared to the scanning exposure cycles (e.g. in the range between 100 Hz and 1000 Hz). It has been found by the inventors that this can result in an improved reduction of the residual deformation. As an additional advantage, the reduced deformation can be obtained much faster.

As an example, a chuck can be subjected to an excitation force of approx. 500 Hz for 30 sec. In this case, the residual deformation found can be smaller than compared to the situation described above.

A further example of the dynamic force is a force which includes a noise burst, e.g. in a predetermined frequency band. A benefit of applying noise (e.g. pink noise) especially comes forward in case of an excitation at a resonance frequency (which will be described below). By applying noise, excitation in a frequency band may be performed, which will result in an excitation at resonance frequencies within that range. Thereby, the excitation is made less sensitive to variations of such resonance frequencies, because, as long as the resonance frequency is within the frequency band of the noise, excitation at that frequency will take place.

In a preferred embodiment, the excitation of the chuck is done at its resonance frequency, preferably at the first resonance frequency of the chuck. Often, this first resonance frequency will be a torsion mode. By doing so, large accelerations may be achieved with a relatively small dynamic force. Thus, relatively little forces are needed to be able to obtain a sufficiently high acceleration of the chuck to enable the deformation. The excitation at a resonance frequency may be performed in a plurality of ways, e.g. by applying a noise burst in a predetermined frequency band (the frequency band including the resonance frequency), applying a frequency sweeping periodic signal (the frequency sweep including the resonance frequency), or applying a single frequency periodic signal having the resonance frequency.

When applied in a lithographic apparatus, once the shaking of the chuck has been performed, an alignment process may be performed, the term alignment should here be interpreted as any procedure to position the patterning device and the substrate onto which the pattern is to be transferred, with respect to each other. This may be by a displacement of one or both of the patterning device and the substrate with respect to each other, e.g. by displacing the substrate table and/or the support, or in any other optical way, e.g. by any suitable operation in the projection system to have the pattern projected onto an appropriate part of the surface of the substrate. In the context of this document, the term stationary force may be understood as a force which is substantially stationary during e.g. a transferring of the pattern from the patterning device onto the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate, the substrate to be arranged on a surface of the substrate table;
    a projection system configured to project the patterned radiation beam onto a target portion of the substrate,
    a chuck constructed to hold the substrate table, the substrate table arranged on a surface of the chuck;
    a positioning device for, in use, displacing the chuck;
    a control unit configured to control the positioning device,
    wherein the control unit is arranged to drive the positioning device to excite the chuck by a substantially dynamic force to enable deformation of the chuck, prior to aligning the patterning device, said dynamic force adapted to mitigate a residual deformation of the chuck caused by a previous acceleration of the chuck, said residual deformation being characterized by an hysteresis and wherein the positioning device is adapted to excite the chuck to reduce said hysteresis.

2. The lithographic apparatus according to claim 1, wherein the control unit is arranged to cause acceleration of the chuck with an alternating acceleration.

3. The lithographic apparatus according to claim 1, wherein the control unit is arranged to drive the positioning device to perform at least about 1000 movement cycles of the chuck.

4. The lithographic apparatus according to claim 1, wherein the control unit is arranged to cause vibration of the chuck.

5. The lithographic apparatus according to claim 4, wherein the control unit is arranged to cause application of a noise burst in a frequency band to the chuck.

6. The lithographic apparatus according to claim 4, wherein the control unit is arranged to cause application of a single frequency periodic signal to the chuck.

7. The lithographic apparatus according to claim 1, wherein the control unit is arranged to drive the positioning device to excite the chuck at a resonance frequency of the chuck.

8. The lithographic apparatus according to claim 7, wherein the resonance frequency comprises a chuck torsion resonance mode.

9. The lithographic apparatus according to claim 1, wherein the control unit is arranged to drive the positioning device to excite the chuck at a higher frequency compared to scanning exposure cycles.

10. A stage apparatus for positioning an object, the stage apparatus comprising:
    a table constructed to hold the object;
    a chuck constructed to hold the table;
    a positioning device for, in use, displacing the chuck;
    a control unit configured to control the positioning device;
    wherein the control unit is arranged to drive the positioning device to excite the chuck by a substantially dynamic force to enable a deformation of the chuck, said dynamic force adapted to mitigate a residual deformation of the chuck caused by a previous acceleration of the chuck, said residual deformation being characterized by an hysteresis and wherein the positioning device is adapted to excite the chuck to reduce said hysteresis.

11. The stage apparatus according to claim 10, wherein the control unit is arranged to drive the positioning device to excite the chuck at a resonance frequency of the chuck.

12. A device manufacturing method comprising transferring a pattern from a patterning device onto a substrate, the substrate being held by a substrate table, the substrate table being held by a chuck, the method comprising:
    a) applying a substantially stationary force between the substrate table and the chuck to hold the substrate table;
    b) exciting the chuck by a substantially dynamic force to enable deformation of the chuck;
    c) aligning the patterning device with the substrate; and
    d) transferring the pattern from the patterning device onto the substrate
    wherein the exciting includes applying a substantially dynamic force to the chuck to enable deformation of the chuck so as to mitigate a residual deformation of the chuck caused by a previous acceleration of the chuck, and wherein the residual deformation is characterized by an hysteresis and wherein said exciting reduces said hysteresis.

13. The method according to claim 12, wherein b) comprises: accelerating the chuck with an alternating acceleration.

14. The method according to claim 13, wherein a level of the acceleration is increased during the accelerating of the chuck.

15. The method according to claim 13, wherein b) comprises performing at least 1000 movement cycles of the chuck.

16. The method according to claim 13, wherein b) comprises vibrating the chuck.

17. The method according to claim 16, wherein b) comprises applying a noise burst in a predetermined frequency band to the chuck.

18. The method according to claim 16, wherein b) comprises:

applying a frequency sweeping periodic signal to the chuck.

19. The method according to claim 16, wherein b) comprises:

applying a single frequency periodic signal to the chuck.

20. The method according to claim 12, wherein the excitating of b) is performed at a resonance frequency of the chuck.

21. The method according to claim 20, wherein the resonance frequency comprises a chuck torsion resonance mode.

* * * * *